United States Patent [19]

Guterman et al.

[11] 4,408,303

[45] Oct. 4, 1983

[54] DIRECTLY-COUPLED AND CAPACITIVELY COUPLED NONVOLATILE STATIC RAM CELL

[75] Inventors: Daniel C. Guterman, Plano; James D. Kupec, Dallas, both of Tex.

[73] Assignee: Mostek Corporation, Carrollton, Tex.

[21] Appl. No.: 335,160

[22] Filed: Dec. 28, 1981

[51] Int. Cl.³ .................... G11C 11/24; G11C 11/40
[52] U.S. Cl. .................................. 365/205; 365/185
[58] Field of Search ................ 365/185, 205; 307/288

[56] References Cited

U.S. PATENT DOCUMENTS 4,132,904  1/1979  Harari ................................. 365/185
4,207,615  6/1980  Mar .................................... 365/185

Primary Examiner—James W. Moffitt

[57] ABSTRACT

A nonvolatile static random access memory cell (10) for storing data in a nonvolative state and recalling the data in its true state is disclosed. Cross-coupled transistors (12, 14) are provided having respective first and second nodes (16, 18) which are maintained at complementary logic states for volatile data storage. At least one tunnel capacitor (34), each having a floating node (36) is operatively coupled to the gate and drain terminals of one of said cross-coupled transistors (12, 14). At least one switch transistor (48) is operatively coupled to one of the first and second nodes (16, 18) and to one tunnel capacitor floating node (36). The at least one tunnel capacitor (34) and the at least one switch transistor (48) operatively coact for nonvolatile saving of volatile data stored in the cross-coupled transistors (12, 14), for recalling nonvolatile stored data in its true state to the cross-coupled transistors (12, 14), by the capacitive imbalance on the first and second nodes (16, 18). Coupling means (50, 54) operatively connected between the switch transistors (48, 52) and the first and second nodes (16, 18) are coupled to one supply ($V_{cc}$ or $V_{SS}$) in such fashion as to prevent interference between volatile and nonvolative data storage.

15 Claims, 8 Drawing Figures

DIRECTLY-COUPLED AND CAPACITIVELY COUPLED NONVOLATILE STATIC RAM CELL

TECHNICAL FIELD

The present invention pertains to semiconductor memories and in particular to such memories which have nonvolatile storage.

BACKGROUND ART

There is an increasing demand in data processing applications for nonvolatile memory storage. Random access memory cells typically store a data state as either a charge on a small capacitor or as the condition of a bi-stable circuit. However, neither of the storage techniques retain the stored data state when power for the memory cell is removed.

A number of forms of MOS memory have been developed in the effort by the prior art to obtain true nonvolatility in semiconductor random access memory (sometimes referred to as RAM) cells. One class of prior art efforts has accomplished this through the coupling of a RAM with some type of nonvolatile memory. The nonvolatile counterpart serves as a one to one mapping of the volatile RAM, and can be loaded with the contents of the RAM when desired, as, for example, just prior to a power loss. This approach has an additional benefit in that it is possible to store two independent data sets simultaneously, one in volatile form and the other in nonvolatile form, with neither disturbing the other, during the normal RAM access operation. As a result, a fixed data set can be recalled from the nonvolatile memory through non-volatile recall as desired. Thus, for example, it is possible to call a fixed data set to initialize a particular data base.

The static RAM cell has generally taken the form of a cross-coupled latch (flip-flop) while the nonvolatile memory has consisted of various Electrically Erasable and Programmable Read Only Memories (EEPROM). These prior art efforts are described, for example, in U.S. Pat. No. 4,103,185, issued July 25, 1978; U.S. Pat. No. 4,103,348, issued July 25, 1978; and U.S. Pat. No. 4,128,773, issued Dec. 5, 1978. The last-listed patent discloses the use of a variable threshold transistor which can store charge on an insulated gate element to change the threshold voltage of the transistor in a nonvolatile logic latch circuit. The charge stored can be maintained for an extended period of time without external power, which provides the nonvolatile data storage. In addition, the prior art is described in an article by Harari et al at page 108 of the 1978 ISSCC Digest and in an article by R. Klein et al at page 111 of the Oct. 11, 1979 issue of Electronics. The Harari et al article describes a thin oxide floating gate EEPROM cell configuration which accomplishes nonvolatile transformation through Fowler-Nordheim (F-N) tunneling.

These prior art approaches, however, suffer from three principal deficiencies. First, the data stored in these prior art nonvolatile systems are in the inverse state rather than in the true state. This complicates the control of the memory since additional steps are required to convert the stored data from the inverse to the true state. Moreover, since this must be carried out each time data is recalled, the speed of operation of the memory is substantially reduced. The further complexity of working with the inverse rather than with the true state of the data can also require that additional circuit elements be used in the memory, thus increasing the cost and size of the overall memory array. Second, when a prior art nonvolatile circuit has been incorporated within the hold-down element of the flip-flop, as described in the Harari et al article, excessive shifts in threshold voltage arising from the presence of the nonvolatile state can degrade or inhibit volatile cell operation. Consequently, undesirable and costly tight design and operating margins are required. Third, while a number of approaches have been described to circumvent the necessity for tight design and operating margins, as for example, the system described in the above-noted U.S. Pat. No. 4,128,773, the solution is generally at the expense of larger memory cell size. This prior art solution fails to obviate the cost problem and may create operating speed problems.

In view of these deficiencies in the prior art, there exists a need for a nonvolatile random access memory cell which can store the true state of data for an extended period of time, provide a fast read of stored data, require a minimum number of operation controls, not be a critical component of the volatile RAM cell, and utilize a minimum number of circuit elements.

BRIEF DESCRIPTION OF THE INVENTION

The present invention comprises a nonvolatile static random access memory cell. A selected embodiment of the invention comprises first and second cross-coupled driver transistors which are connected to have first and second stable states. The first driver transistor has the drain and source terminals thereof connected between a first node and a first power terminal. The second driver transistor has the drain and source terminals thereof connected between a second node and the first power terminal. The memory cell further includes first and second tunneling capacitors, the first tunneling capacitor operatively connected between the drain and gate of the first driver transistor and having a first floating node and the second tunneling capacitor operatively connected between the drain and gate of the second driver transistor and having a second floating node. First and second switching transistors and first and second coupling capacitors also are included. The drain of the first switching transistor is connected through the first coupling capacitor to a second power terminal and the drain of the second switching transistor is connected through the second coupling capacitor to the second power terminal. The source of the first switching transistor is connected to the first node, and its gate is connected to the first floating node. The source of the second switching transistor is connected to the second node and its gate is connected to the second floating node.

BRIEF DESCRIPTION OF THE DRAWINGS

For a more complete understanding of the present invention and the advantages thereof, reference is now made to the following DESCRIPTION taken in conjunction with the accompanying drawings in which.

DETAILED DESCRIPTION

Figure 1:
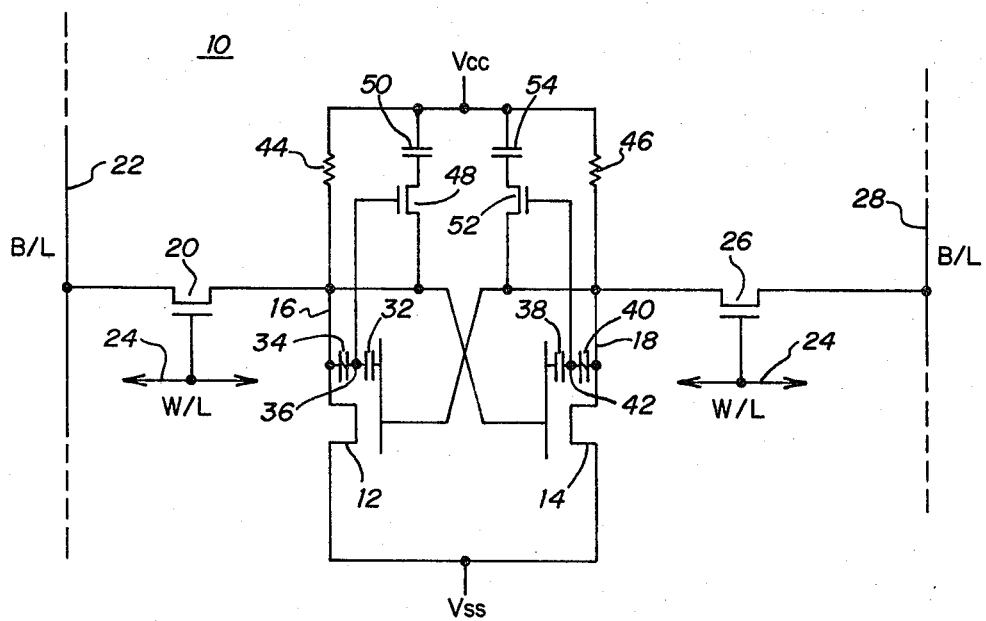
FIG. 1 is a schematic illustration of a first embodiment of a nonvolatile static random access memory cell in accordance with the present invention.

Referring first to FIGS. 1-4, nonvolatile static random access memory (RAM) cells according to the present invention, using capacitative coupling, are shown. In each of the figures described hereinafter (FIGS. 1-8), like elements are denoted by the same reference numerals. Also the examples outlined in these figures ae based on n-channel MOSFET technology, but the general concepts need not be restricted to that technology.

Referring now to FIG. 1, there is shown a schematic illustration of a capacitively-coupled nonvolatile static random access memory cell 10 in accordance with the present invention. The memory cell 10 includes a pair of cross-coupled driver transistors 12 and 14 in which the drain terminal of transistor 12 and the gate terminal of transistor 14 are connected to a node 16. The drain terminal of transistor 14 and the gate terminal of transistor 12 are connected to a node 18. The source terminals of transistors 12 and 14 are connected to a power terminal designated as $V_{SS}$.

An access transistor 20 has the drain and source terminals thereof connected between a bit line 22 and node 16. The access transistor 26 has the drain and source terminals hereof connected between node 18 and a bit line 28. The gate terminals of transistors 20 and 26 are connected to a word line 24. The overall memory circuit which includes memory cell 10 receives memory addresses which are decoded to selectively activate the word line 24 and the bit lines 22 and 28 to select the memory cell 10.

A capacitor 32 and a tunneling capacitor 34 are connected in series between the drain terminal and gate terminal of transistor 12 and form a floating node 36. Similarly, capacitor 38 and tunneling capacitor 40 are connected in series between the drain terminal and gate terminal of transistor 14 and form a floating node 42. The tunneling capacitors 34 and 40 are manufactured such that no tunneling occurs when a standard cell operating voltage (e.g. 5.0 volts) is applied and such that tunneling will occur if the voltage level is increased significantly (e.g. to 10-20 volts). Resistor 44 is connected between node 16 and a power terminal $V_{CC}$ and a resistor 46 is connected between node 18 and the power terminal $V_{CC}$. The resistors 44 and 46 serve as loads for volatile storage operation.

A switching transistor 48 and a coupling capacitor 50 are connected in series. Transistor 48 has its source terminal connected to the gate terminal of transistor 14, its gate terminal connected to floating node 36 and its drain terminal connected to capacitor 50. The capacitor 50 has a second terminal connected to the power terminal $V_{CC}$. A second switching transistor 52 is connected in series with a second coupling capacitor 54. Transistor 52 has its source terminal connected to the gate terminal of transistor 12, its gate terminal connected to floating node 42, and its drain terminal connected to capacitor 54 which is further connected to $V_{CC}$.

The memory cell 10 is designed to have a greater capacitance for capacitors 32 and 38 than for capacitors 34 and 40. Therefore, most of the voltage applied between the gate and drain of transistors 12 and 14 appears across tunneling capacitors 34 and 40, but with opposite polarities, depending on the state of memory cell 10.

The memory cell 10 of FIG. 1 has four modes of operation: write, read, store (or save) and recall. To perform a write operation the word line 24 is activated to render conductive the access transistors 20 and 26. Complementary voltage levels (e.g. 0.0 volts and 5.0 volts) are then input on the bit lines 22 and 28 and are transmitted through the access transistors 20 and 26 to nodes 16 and 18. The voltage levels at the nodes 16 and 18 serve to set the on/off condition of transistors 12 and 14 and thereby establish the state of the flip-flop comprising driving transistors 12 and 14. The access transistors 20 and 26 are then turned off leaving the data stored in the cross-coupled driver transistors 12 and 14. A typical operational supply voltage $V_{CC}$ is 5.0 volts.

The read operation for the memory circuit comprises activating the access transistors 20 and 26 which connect node 16 to bit line 22 and node 18 to bit line 28. The bit lines are then pulled to complementary states corresponding to the data state of the cross-coupled transistors 12 and 14. The access transistors 20 and 26 are then turned off.

The above description of the write and read operations is typical to that of a conventional volatile static random access memory cell. The principal difference between a conventional static RAM cell and memory cell 10 of the instant invention insofar as these operations are concerned is that there exists a somewhat higher capacitance at nodes 16 and 18, which depends in part on the stored data states, as described in more detail hereinbelow. However, this somewhat higher capacitance at nodes 16 and 18 does not affect the read operation and may possibly help in preventing disturbances to the random access operation.

The store and recall operations, involving the nonvolatile storage elements, will now be described. The power supply $V_{CC}$ normally is maintained at 5.0 volts, as indicated above. In the random access mode, nodes 16 and 18 are thus maintained at complementary 0.0 and 5.0 volts operating levels, depending on the volatile data state.

Assume, for example, that the transistors 12 and 14 are set such that node 16 is at 5.0 volts and node 18 is at ground. This means that transistor 12 is turned off and transistor 14 is turned on. To store data in the nonvolatile storage elements, access transistors 20 and 26 are kept off and the power supply $V_{CC}$ is ramped from its normal 5.0 volts to about 20.0 volts. Ramping $V_{CC}$ to 20.0 volts applies 20.0 volts to node 16, while node 18 remains at 0.0 volts. The 20.0 volts between nodes 16 and 18 cause electrons to tunnel from floating node 36 to node 16. This tunneling results in a net positive charge being stored on node 36 that will tend to turn on transistor 48. The 20.0 volts between nodes 16 and 18 also cause electrons to tunnel across capacitor 40 to the floating node 42. This tunneling results in a net negative charge being stored on node 42 that will tend to turn off transistor 52. This establishes the nonvolatile storage state of cell 10 for node 16 high and node 18 low. It is worth noting that the storage state described would result regardless of the previous state of the nonvolatile memory, so no erase or preset operation is required.

While this description is based on transistor 14 being on and transistor 12 being off, obviously there is a counterpart operation when transistor 12 is on and transistor 14 is off.

The nonvolatile data is thus stored without disrupting the state of the volatile memory. $V_{CC}$ can then be returned to the normal 5.0 volts operating level and the "on-off" status in the nonvolatile memory is stored in preparation for the recall operation. Operation of the volatile static memory cell thereafter at the 5.0 volt level does not disturb or interfere with the stored nonvolatile state, because of the extremely high field dependence associated with the tunneling capacitors.

In the recall mode, the word line 24 is held at 0.0 volts keeping access transistors 20 and 26 off. $V_{CC}$ is taken to 0.0 volts, which equilibrate the storage nodes 16 and 18 and then $V_{CC}$ is ramped back to 5.0 volts. (In the alternative, $V_{SS}$ can be ramped to 5.0 volts and then back to 0.0 volts.) Continuing from the above store example the positive and negative charge stored on floating gates 36 and 38 respectively result in transistor 48 being initially turned on while 52 remains off exposing node 16 to the $V_{cc}$ ramp through transistor 48 and capacitor 50. Since transistor 48 maintains a greater turn-on bias than transistor 52, then as $V_{CC}$ is ramped upward, more charge will be coupled through capacitor 50 and transistor 48 to node 16 than is coupled through capacitor 54 and transistor 52 to node 18. This initiates the regenerative action wherein node 16 becomes more positive and turns on transistor 14, which pulls node 18 low, which causes transistor 12 to remain off, permitting node 16 to be pulled to essentially $V_{CC}$. Note that the recall step has set the flip-flop comprising transistors 12 and 14 to the initial state which existed when the storage step occurred. Thus, the stored data has been recalled in the true rather than the inverse state.

The mode of equilibration and the ramping rate depend primarily on the particular cell configuration and its sensitivity to device imbalances. The embodiments shown in FIGS. 1, 3 and 5 are relatively insensitive to the impedance values of the resistors. The embodiment shown in FIG. 4 depends on resistance matching. The sensitivity of the remaining embodiments described herein depends on whether recall is performed by taking $V_{CC}$ from 5.0 volts to 0.0 volts and ramping back to 5.0 volts (as described above) or by ramping $V_{SS}$ from 0.0 volts (a normal operating level) to 5.0 volts and then back to 0.0 volts. The remaining embodiments are less sensitive in the latter case. The embodiments described herein in connection with FIGS. 1-4 have the potential for small cell size, because the nonvolatile portion (the switching transistors and coupling capacitors) can be of minimum area since only small imbalances are needed for recall of the nonvolatile data.

For cells using poly-R (polysilicon resistor) loads, it is desirable to avoid having a resistor as an element in the nonvolatile sensing circuitry because of the difficulty in controlling polysilicon resistor values. Large resistor imbalances result in large RC imbalances which could yield improper sensing. Better balancing can be achieved in the case of depletion loads, but dynamic sensing may become more difficult because of considerably higher load conduction levels. Two rules of thumb for cell load design are suggested. First, load conduction current should be much smaller than displacement currents required for differential sensing. Second, RC time constants should be long compared to ramp times required to ensure proper state separation.

Figure 2:
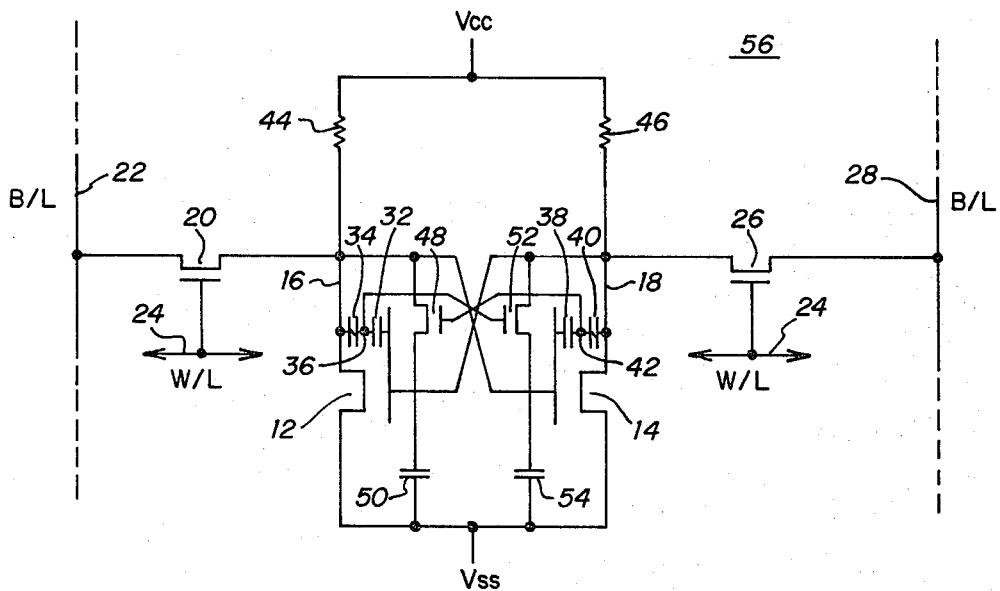
FIG. 2 is a schematic illustration of a second embodiment of a nonvolatile static random access memory cell in accordance with the present invention.
Figure 3:
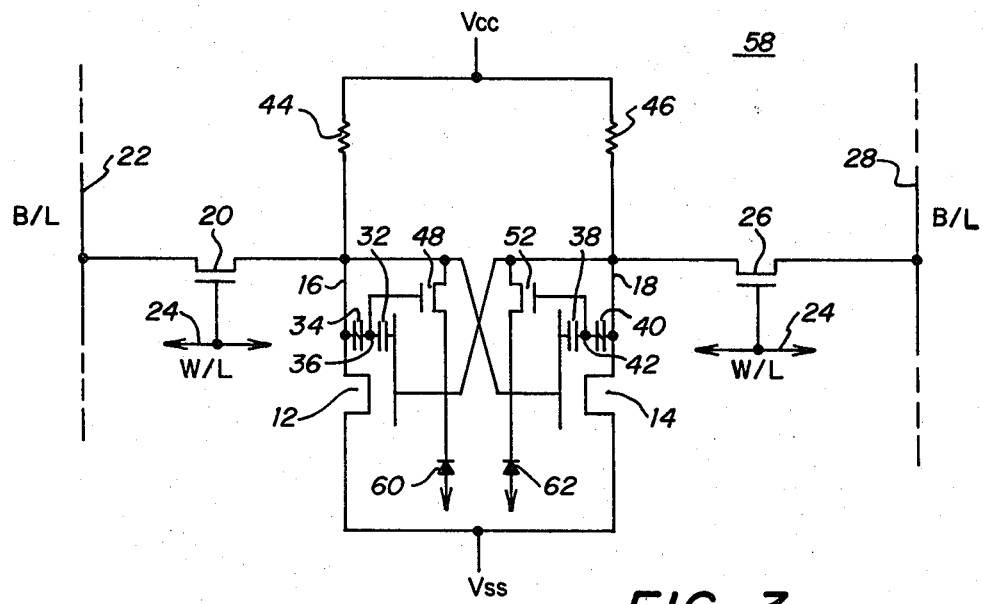
FIG. 3 is a schematic illustration of a third embodiment of a nonvolatile static random access memory cell in accordance with the present invention.

Referring next to FIG. 2, a second embodiment of a capacitively-coupled nonvolatile random access memory cell is shown, with like elements indicated by like numerals. In FIG. 2, the memory cell 56 again includes a pair of cross-coupled driver transistors 12 and 14 in which the drain terminal of transistor 12 and the gate terminal of transistor 14 are connected to a node 16. The drain terminal of transistor 14 and the gate terminal of transistor 12 are in like manner connected to a node 18. The source terminals of transistors 12 and 14 are connected to a power terminal designated as $V_{SS}$.

Again, an access transistor 20 has the drain and source terminal thereof connected between a bit line 22 and node 16. An access transistor 26 has the drain and source terminals thereof connected between node 18 and a bit line 28. The gate terminals of transistors 20 and 26 are connected to a word line 24. Once again, the overall memory circuit which includes memory cell 56 receives memory addresses which are decoded to selectively activate the word line 24 and the bit lines 22 and 28 to select the memory cell 56.

As in the embodiment of FIG. 1, capacitor 32 is connected to the gate of transistor 12 and a tunneling capacitor 34 is connected to the drain of transistor 12 and to capacitor 32. A floating node 36 extends between capacitor 32 and tunneling capacitor 34. In like fashion, a tunneling capacitor 40 connects floating node 42 to the drain of transistor 14 while capacitor 38 connects the floating node 42 to the gate of transistor 14. Switching transistors 48 and 52 and coupling capacitors 50 and 54 are again provided. However, in contrast with FIG. 1, the drain terminal of transistor 48 is coupled to node 16, its gate terminal is coupled to floating node 42 and its source terminal is coupled to capacitor 50. Capacitor 50 also is coupled to power source $V_{SS}$. The drain terminal of switching transistor 52 is coupled to node 18, its gate is coupled to floating node 36 and its source is coupled to capacitor 54. Capacitor 54 also is coupled to power source $V_{SS}$. The read, write and save operations of the memory cell 56 of FIG. 2 are the same as the read, write and save operations described in connection with FIG. 1, and their descriptions will not be repeated here for the sake of brevity. In the recall operation, $V_{CC}$ is either brought to 0.0 volts to equilibrate nodes 16 and 18 and then back to 5.0 volts or $V_{SS}$ is brought to 5.0 volts to equilibrate nodes 16 and 18 and then back to 0.0 volts. By way of example assume in the embodiment of FIG. 2, that transistor 12 is off and transistor 14 is on. After a store operation as described previously, the gate of transistor 52 in FIG. 2 receives a net positive charge and the gate of transistor 48 receives a net negative charge, resulting in a greater coupling of node 18 to $V_{SS}$. As $V_{CC}$ ramps up to 5.0 volts node 16 becomes more positive than node 18, by virtue of less capacitive loading, thereby turning on transistor 14, which turns off transistor 12 in regenerative fashion to re-establish the stored state of the memory cell.

Referring next to FIG. 3, another embodiment of the capacitively coupled nonvolatile random access memory cell is shown. This embodiment corresponds in many respects to the embodiment shown in FIG. 1, and, again, like elements are denoted by like numerals. The memory cell 58 of FIG. 3 includes a pair of cross-coupled driver transistors 12 and 14 in which the drain terminal of transistor 12 and the gate terminal of transistor 14 are connected to a node 16. The drain terminal of transistor 14 and the gate terminal of transistor 12 are connected to a node 18. The source terminals of transistors 14 and 12 are connected to a power terminal $V_{SS}$. An access transistor 20 has the drain and source terminals thereof connected between a bit line 22 and node 16. An access transistor 26 has drain and source terminals thereof connected between node 18 and a bit line 28. The gate terminals of transistors 20 and 26 are connected to a word line 24. Switching transistors 48 and 52, and diodes 60 and 62 are provided. The gate terminal of transistor 48 is connected to floating node 36, its drain terminal is connected to node 16 and its source terminal is connected to the cathode of diode 60. The anode of diode 60 is the substrate. Switching transistor 52 has its source terminal connected to the cathode of diode 62, its drain terminal connected to node 18 and its gate terminal connected to floating node 42. Again, the anode of diode 62 is the substrate. The circuit of FIG. 3 uses the capacitance to the substrate developed via diodes 60 and 62 in lieu of capacitors 50 and 54 of FIG. 1.

The read, write and store operations of the memory circuit of FIG. 3 is the same as previously described in connection with FIG. 1 and, therefore, those descriptions will not be repeated here for the sake of brevity. However, in the recall mode of operation, $V_{SS}$ is first brought from 0.0 volts to 5.0 volts to equilibrate nodes 16 and 18 and is then ramped back to 0.0 volts. Again assuming the example that transistor 52 is biased off, reflecting the fact that transistor 14 was "on" and that transistor 48 is biased on, reflecting the fact that transistor 12 was "off", node 18 more quickly moves toward 0.0 volts, by virtue of less capacitive loading turning transistor 12 off and latching transistor 14 on, again reflecting the initial data state.

Figure 4:
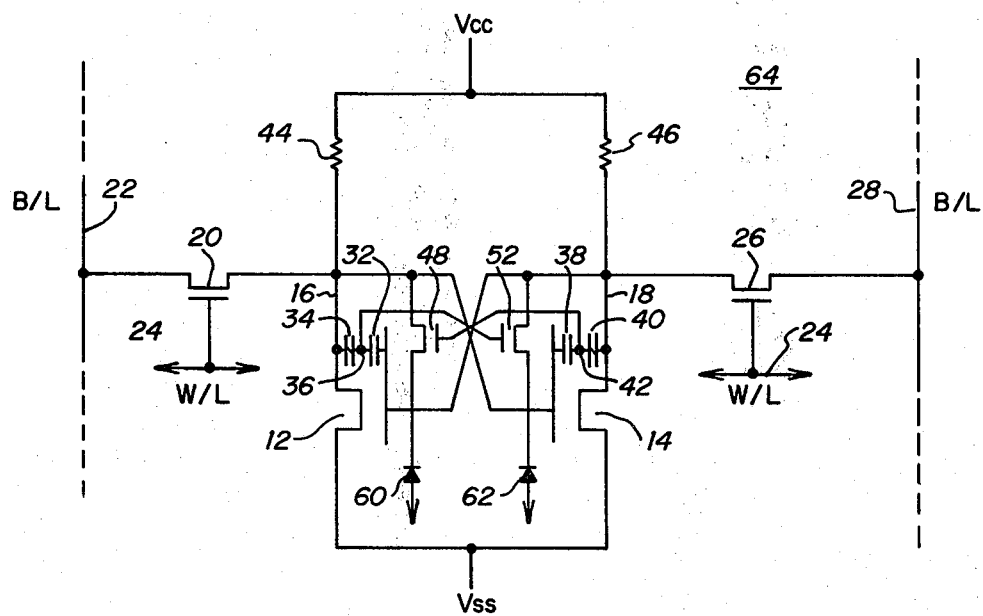
FIG. 4 is a schematic illustration of a fourth embodiment of a nonvolatile static random access memory cell in accordance with the present invention.
Figure 5:
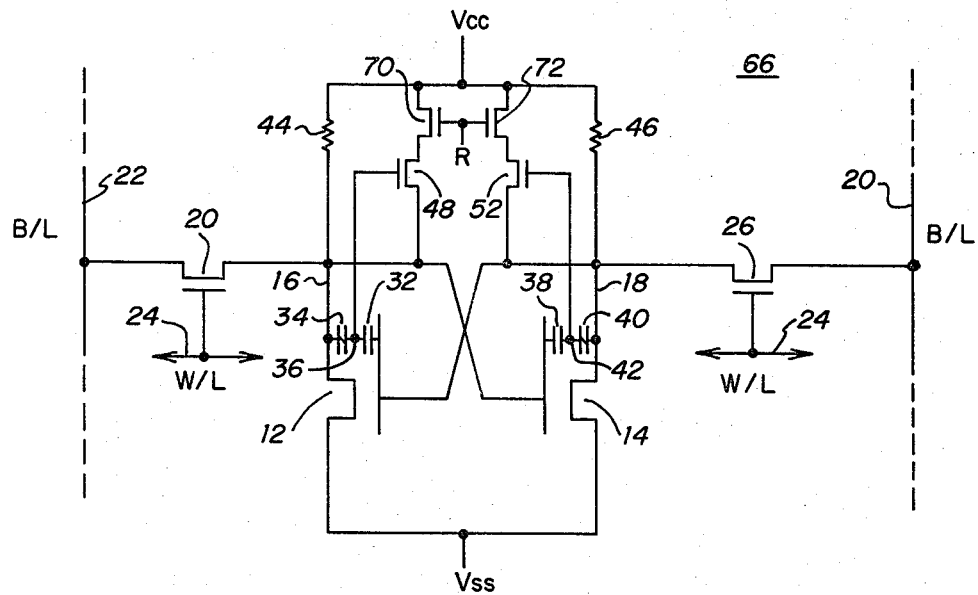
FIG. 5 is a schematic illustration of a fifth embodiment of a directly coupled nonvolatile static random access memory cell in accordance with the present invention.

Referring next to FIG. 4, where like elements are again denoted by like numerals, an embodiment similar to that described in FIG. 3 is shown for a cell 64. For purposes of brevity, only the differences between FIGS. 3 and 4 will be described at this point. Here, in FIG. 4, switching transistor 48 (as in FIG. 3) has its source terminal connected to the cathode of diode 60 and has its drain terminal connected to node 16. However, in the embodiment of FIG. 4, the gate terminal of switching transistor 48 is connected to floating node 42. Switching transistor 52 has its drain terminal connected to node 18 and its source terminal connected to the cathode of diode 62, but its gate terminal is now connected to floating node 36. The write, read and store operations proceed in the same fashion as previously described.

In the recall mode of operation, $V_{CC}$ is first brought to 0.0 volts and is then ramped back to 5.0 volts. Operation in the recall mode will otherwise be apparent from the foregoing description taken in conjunction with FIGS. 1-3.

An alternative embodiment of the subject invention is to couple the nonvolatile information by direct rather than capacitive means. This is done by eliminating the coupling (imbalance) capacitors, such as 50 and 54, and providing direct paths between the switching transistors and the power source to which they are connected. Such an arrangement is shown generally in the embodiments of FIGS. 5-7. However, with the coupling capacitors eliminated, steps must be taken to avoid disturbing the RAM operation. Accordingly, as shown in FIG. 5, the capacitors 50 and 54 have been replaced by series addressing transistors 70 and 72 which are controlled by a common recall line R. Otherwise, the elements of FIG. 5 correspond identically to those of FIG. 1, and like elements are denoted by like reference numerals.

The write and read operations performed with the memory cell 66 of FIG. 5 are as described above for FIG. 1 and will not be repeated here. To store, or save data, the power supply $V_{CC}$ is ramped from 5.0 volts to 20.0 volts and the recall line is kept at 0.0 volts. Nonvolatile state data storage otherwise occurs in the same fashion as described in connection with FIGS. 1-4. The recall operation also occurs generally as described in connection with FIG. 1. However, in addition to $V_{CC}$ being brought to 0.0 volts and then ramped back to 5.0 volts, the voltage on recall line R is simultaneously brought to 5.0 volts and later brought back to 0.0 V. (Alternatively, the voltage on R, $V_{CC}$ and $V_{SS}$ can be ramped to 5.0 volts, and then $V_{SS}$ can be ramped to 0.0 volts.) Assuming as from the description of FIG. 1 that transistor 14 is on and transistor 12 is off, transistor 48 is biased on and transistor 52 is biased off. As the voltage between $V_{CC}$ and $V_{SS}$ increases node 16 becomes more positive than node 18, turning transistor 14 on which turns transistor 12 off regeneratively, thereby reflecting the true state of the stored data.

Figure 6:
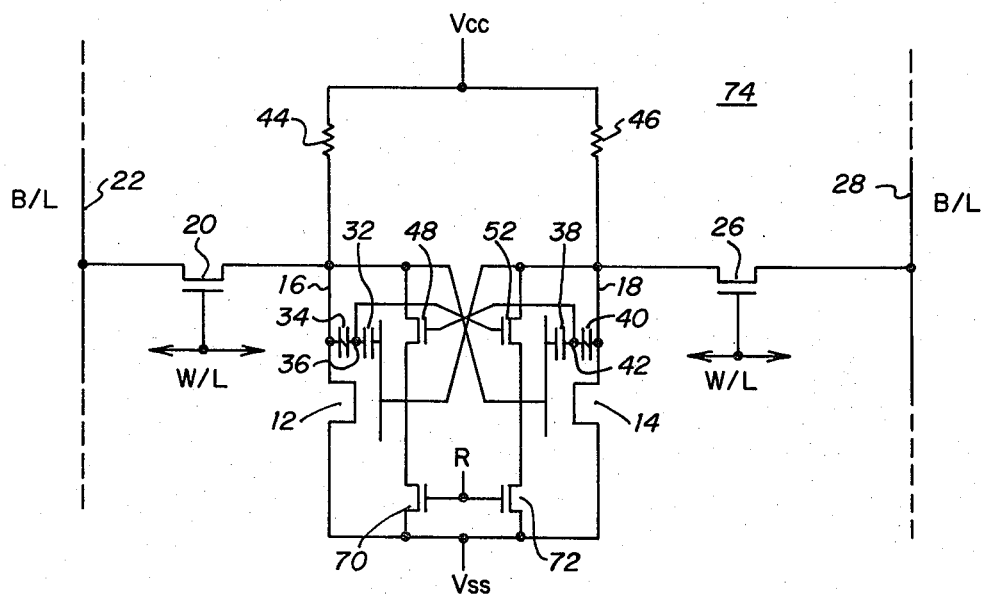
FIG. 6 is a schematic illustration of a sixth embodiment of a nonvolatile static random access memory cell in accordance with the present invention.

Referring now to FIG. 6, an alternative embodiment of the directly coupled nonvolatile random access memory cell of FIG. 5 is shown. The elements shown in FIG. 6 correspond to the elements of the circuit of FIG. 5, the only differences between cell 74 of FIG. 6 and cell 66 of FIG. 5 being the connections of the gates of switching transistors 48 and 52 and the connections of series addressing transistors 70 and 72. Thus, in the embodiment of FIG. 6, switching transistor 48 has its gate terminal connected to floating node 42 and switching transistor 52 has its gate terminal connected to floating node 36 (the reverse of FIG. 5). Also, series addressing transistors 70 and 72 are connected, respectively, between power terminal $V_{SS}$ and switching transistors 48 and 52 respectively. The write, read, store and recall operations of the embodiment of FIG. 6 are the same as described above for FIG. 2 with the addition of the addressing transistors shown in FIG. 5 and will not be repeated here.

Figure 7:
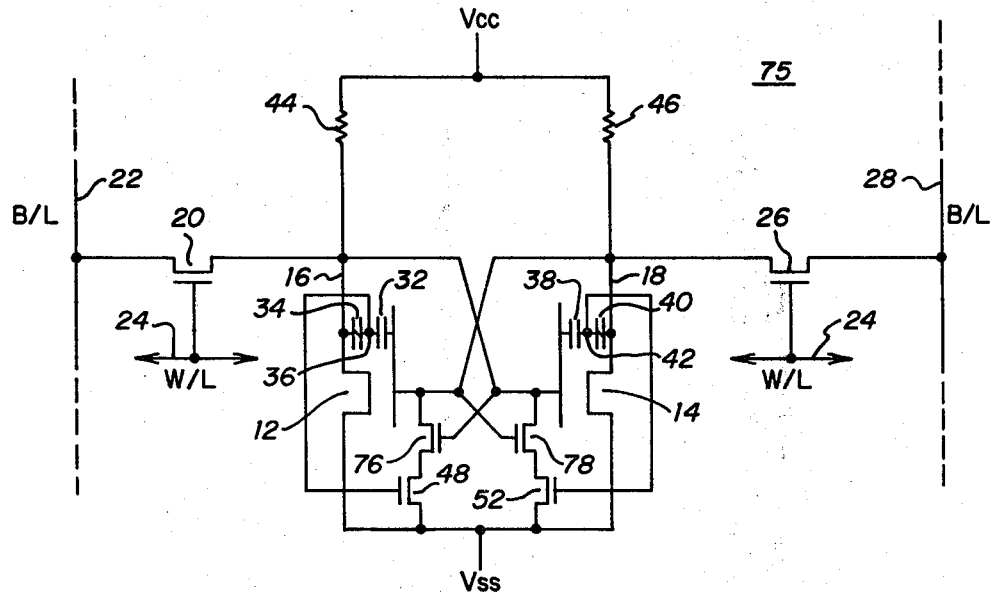
FIG. 7 is a schematic illustration of a seventh embodiment of a nonvolatile static random access memory cell in accordance with the present invention.

Referring next to FIG. 7, an internal latchout configuration rather than series addressing transistors is used in this directly coupled nonvolatile random access memory circuit in order to avoid disturbing the volatile state. In this circuit, the memory cell 75 again includes a pair of cross-coupled driver transistors 12 and 14 in which the drain terminal of transistor 12 and the gate terminal of transistor 14 are connected to a node 16. The drain terminal of transistor 14 and the gate terminal of transistor 12 are in like manner connected to a node 18. The source terminals of transistors 12 and 14 are connected to a power terminal designated as $V_{SS}$.

An access transistor 20 has the drain and source terminals thereof connected between a bit line 22 and node 16. An access transistor 26 has the drain and source terminals thereof connected between node 18 and a bit line 28. The gate terminals of transistors 20 and 26 are connected to a word line 24. Once again, the overall memory circuit which includes memory cell 75 receives memory addresses which are decoded to selectively activate the word line 24 and the bit lines 22 and 28 to select the memory cell 75.

Capacitor 32 is connected between the gate of transistor 12 and floating node 36. Tunneling capacitor 34 is connected between node 16 and node 36. In like fashion, a tunneling capacitor 40 is connected between floating node 42 and node 18 while a capacitor 38 is connected between the floating node 42 and node 16.

Switching transistors 48 and 52 and latching transistors 76 and 78 are provided. The drain of transistor 48 is coupled to the source of transistor 76, its gate is coupled to floating node 36 and its source is coupled to power source $V_{SS}$. In similar fashion, the drain of switching transistor 52 is coupled to the source of transistor 78, its gate is coupled to floating node 42 and its source is coupled to power source $V_{SS}$. Transistor 76 has its gate terminal connected to node 16 and its drain terminal connected to node 18, while transistor 78 has its gate connected to node 18 and its drain connected to node 16.

In read, write and store operations transistors 76 and 78 do not disturb the cross-coupled latch state of transistors 12 and 14 by their complementary connections. That is, the gate and drain of transistor 76 are connected to complementary nodes, 16 and 18 respectively, and therefore receive complementary voltage levels, and therefore attempt to reinforce these voltage levels. The similar argument goes for transistor 78, and therefore the state cannot be interfered with independent of the nonvolatile levels at the gates of transistors 48 and 52. This configuration results in read, write, store and recall operations of the embodiment of FIG. 7 to follow those of the circuit of FIG. 2.

Figure 8:
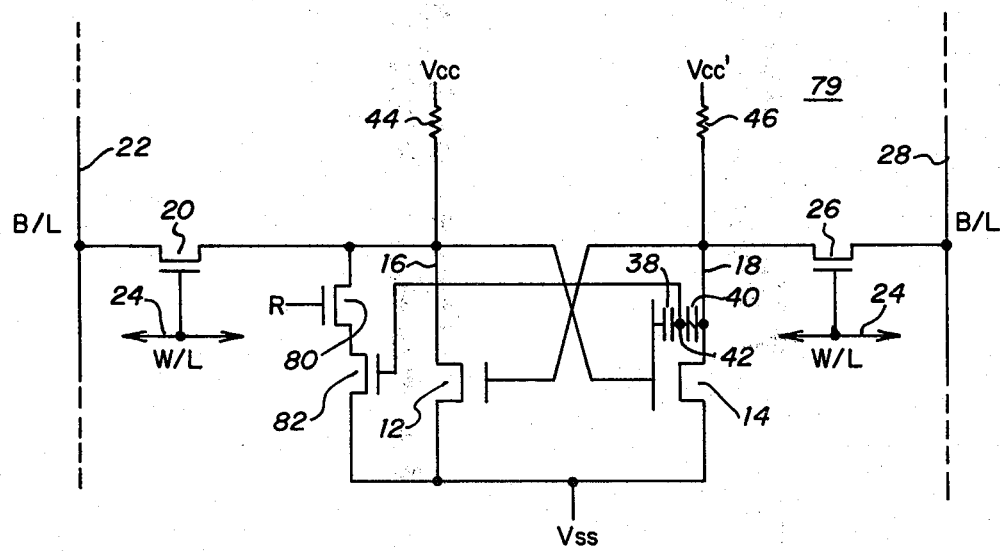
FIG. 8 is a schematic illustration of an eighth embodiment of a nonvolatile static random access memory cell in accordance with the present invention.

A directly coupled nonvolatile random access memory also can be achieved using a single floating gate transistor, as shown in the embodiment of FIG. 8. This single sided embodiment provides for the smallest cell area, but requires greater amounts of charge to be stored on the gate of the floating gate transistor, so that it is switched between being "on" and "off" for nonvolatile storage.

The memory cell 79 of FIG. 8 includes a pair of cross-coupled driver transistors 12 and 14 in which the drain of transistor 12 and the gate of transistor 14 are connected to a node 16. The drain terminal of transistor 14 and the gate terminal of transistor 12 are connected to a node 18. The source terminals of transistors 12 and 14 are connected to a power terminal designated as $V_{SS}$. A tunneling capacitor 40 and a capacitor 38 are connected in series between the gate and drain terminals of transistor 14 and have floating node 42 there between. A switching transistor 82 has its gate connected to floating node 42, its source connected to power source $V_{SS}$, and its drain connected to the source terminal of an addressing transistor 80, which is used to isolate switching transistor 82 during normal random access operation. The drain of transistor 80 is connected to node 16 and it is gated by a recall line R. To insure that proper data is recalled, it is necessary to have two power lines $V_{CC}$ and $V'_{CC}$ that can be sequenced. $V_{CC}$ is connected via resistor 44 to node 16 and $V'_{CC}$ is connected via resistor 46 to node 18.

In the embodiment of FIG. 8, transistor 82 will either be "on" or "off", depending on the state of the data stored in the volatile latch. This is accomplished by ramping $V_{CC}$ and $V'_{CC}$ from the normal 5.0 volts to 20.0 volts. This results in charge transport across tunneling capacitor 38 onto floating gate 42 which biases transistor 82 "on" or "off". To recall the stored data, $V_{CC}$ and $V'_{CC}$ are brought to 0.0 volts, the gate terminal of addressing transistor 80 is brought to 5.0 volts by signal R, and then $V_{CC}$ is ramped back to 5.0 volts. If transistor 82 is in the "on" condition, node 16 remains low. Otherwise it tracks $V_{CC}$. Then $V'_{CC}$ is ramped back to 5.0 volts. Node 18 will follow if transistor 14 is off, and this depends on the voltage that node 16 attains (i.e. depending on the status of transistor 82). The gate of addressing transistor 80 is then taken to 0.0 volts with correct data thus having been transferred from nonvolatile storage, and into the volatile latch.

Each of the transistors described herein is an N-channel device; however, equivalent circuits can be fabricated with P-channel devices.

In summary the present invention comprises a nonvolatile static RAM cell which can store the data state of the cell for an extended period of time despite the loss of supply power. Upon recall the memory cell is restored to the true data state of the stored data. Further, the memory cell can be reset without affecting the normal read and write operations. Although several embodiments of the invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention.

We claim:

1. A nonvolatile static random access memory cell comprising:
   cross-coupled transistor means having first and second nodes which are maintained at complementary logic states for volatile data storage;
   at least one tunnel capacitor means, each said tunnel capacitor means connected to a corresponding floating node and operatively coupled to the gate and drain terminals of one of said cross-coupled transistor means;
   at least one switch transistor means, each said switch transistor means operatively coupled to one of said first and second nodes and to the floating node of one of said at least one tunnel capacitor means; and
   means for coupling each of said switch transistor means to a first power terminal for said memory cell, said at least one tunnel capacitor means charged for nonvolatile data storage wherein volatile data is stored in said cross-coupled transistor means, said means for coupling operatively coactive with said at least one switch transistor means for recalling nonvolatile stored data in its true state to said cross-coupled transistor means.

2. The device of claim 1, wherein there are provided two transistors in said cross-coupled transistor means, two tunnel capacitor means, and first and second switch transistor means, and including a capacitor member connected in series between each of said floating nodes and one of said first and second nodes and a resistor connected between each of said first and second nodes and said first power terminal of said memory cell.

3. The device of claim 2, wherein said means for coupling is comprised of first and second coupling capacitive means operatively connected, respectively, to said first and second switch transistor means.

4. The device of claim 3 wherein said first and second coupling capacitive means are first and second capacitors.

5. The device of claim 4 wherein said first and second coupling capacitors are operatively connected, respectively, between said first and second switch transistor means and said first power terminal.

6. The device of claim 4 wherein said first and second coupling capacitors are operatively connected, respectively, between said first and second switch transistor means and a second power terminal.

7. The device of claim 3 wherein said first and second coupling capacitive means are first and second diodes connected between said first and second switch transistor means and a substrate of said memory cell.

8. The device of claim 2, wherein said means for coupling is comprised of a series addressing transistor means controlled by a recall signal line, interposed between said first and second switch transistor means and one power terminals of said memory cell.

9. The device of claim 2, wherein said means for coupling is comprised of internal latchout means coupled between said at least one switch transistor means and one of said first and second nodes.

10. A nonvolatile static random access memory cell, comprising:
   first and second cross-coupled driver transistors having first and second stable states, said first driver transistor having the drain and source terminals thereof connected between a first node and a first power terminal and said second driver transistor having the drain and source terminals thereof connected between a second node and said first power terminal;
   first and second switching transistors, said first switching transistor having the drain and source terminals thereof operatively connected between said first node and a power terminal and said second switching transistor having the drain and source terminals thereof operatively connected between said second node and a power source to which said first floating gate switching transistor is connected;
   first and second tunneling capacitors and first and second capacitors, said first tunneling capacitor and said first capacitor connected in series between the gate and drain of said first driver transistor and having a first floating node therebetween and said second tunneling capacitor and said second capacitor connected in series between the gate and drain of said second driver transistor and having a second floating node therebetween, the gate terminal of one of said first and second switching transistors connected to said first floating node and the other gate terminal of said first and second switching transistors connected to said second floating node; and
   means for coupling said switching transistors to a power terminal to decouple volatile state and nonvolatile state data storage.

11. The device of claim 10 wherein the power terminal to which said first and second switching transistors are operatively connected is a common substrate terminal.

12. The device of claim 10, wherein the power terminal to which said first and second switching transistors are operatively connected is a first power terminal and wherein a second power terminal is operatively connected through impedance means to said first and second nodes.

13. The device of claim 10 wherein said means for coupling is first and second capacitors interposed between each of said first and second switching transistors and a power terminal.

14. The device of claim 10 wherein said means for coupling is at least one series addressing transistor controlled by a recall signal line and operatively coupled between said switching transistors and a power terminal.

15. The device of claim 10 wherein said means for coupling includes an internal latchout means.

* * * * *